United States Patent [19]

Burns

[11] Patent Number: 4,466,183

[45] Date of Patent: Aug. 21, 1984

[54] INTEGRATED CIRCUIT PACKAGING PROCESS

[75] Inventor: Carmen D. Burns, San Jose, Calif.

[73] Assignee: National Semiconductor Corporation, Santa Clara, Calif.

[21] Appl. No.: 373,921

[22] Filed: May 3, 1982

[51] Int. Cl.³ .................. H01R 43/00; H01L 23/50
[52] U.S. Cl. ........................ 29/827; 357/69; 428/582; 174/52 PE; 29/827
[58] Field of Search ............ 29/827, 846, 576 S; 174/52 FP, 52 PE; 339/65; 357/70, 69; 428/582

[56] References Cited

U.S. PATENT DOCUMENTS

| 3,803,709 | 4/1974 | Beltz et al. ............... 29/827 |
| 3,882,597 | 5/1975 | Chayka et al. ............ 29/827 |
| 4,063,993 | 12/1975 | Burns . | |
| 4,089,733 | 5/1978 | Zimmerman ........... 174/52 FP X |
| 4,204,317 | 5/1980 | Winn ...................... 29/827 |
| 4,330,790 | 5/1982 | Burns . | |
| 4,331,831 | 5/1982 | Ingram et al. ............ 174/52 FP |
| 4,355,463 | 10/1982 | Burns . | |
| 4,380,042 | 4/1983 | Angelucci et al. ...... 174/52 FP X |

FOREIGN PATENT DOCUMENTS 56-8863  1/1981  Japan .................................. 29/827

Primary Examiner—Howard N. Goldberg
Assistant Examiner—Carl J. Arbes
Attorney, Agent, or Firm—Gail W. Woodward; Paul J. Winters; Michael J. Pollock

[57] ABSTRACT

In an automatic tape assembly process an IC chip is bonded to the finger pattern created in a metal assembly tape. Then the housing is applied to encapsulate the IC during assembly. An insulating strip is then applied to the metal fingers that will ultimately become the packaged device loads. The strip is located just inside that point where the fingers will be excised from the tape so that after excision the strip will hold the leads in position for testing and handling.

10 Claims, 8 Drawing Figures

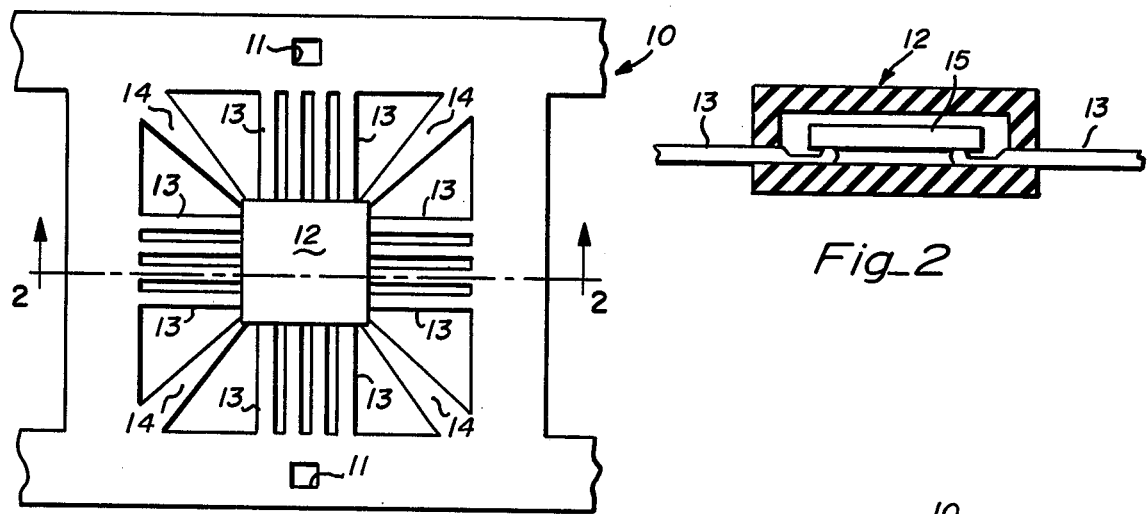
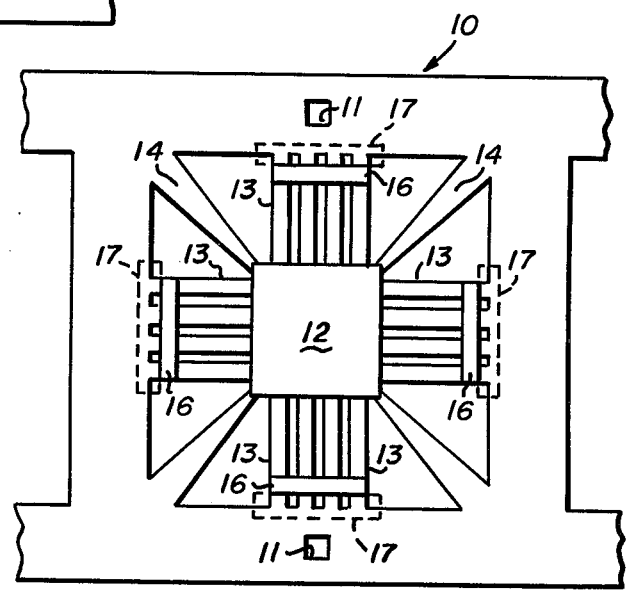
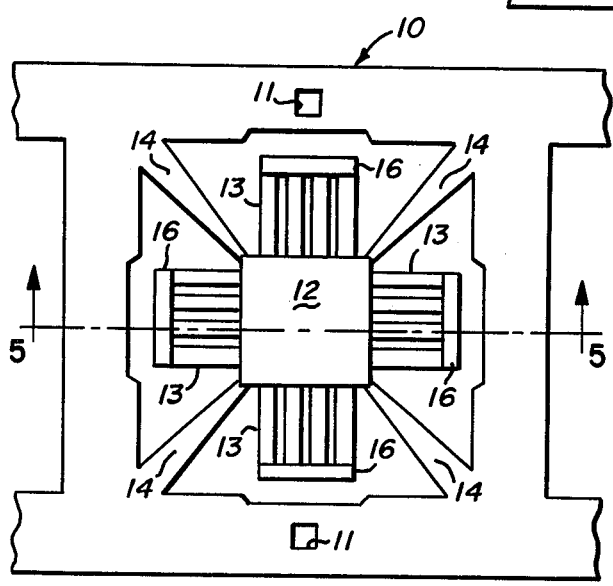
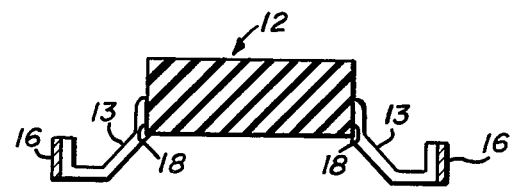

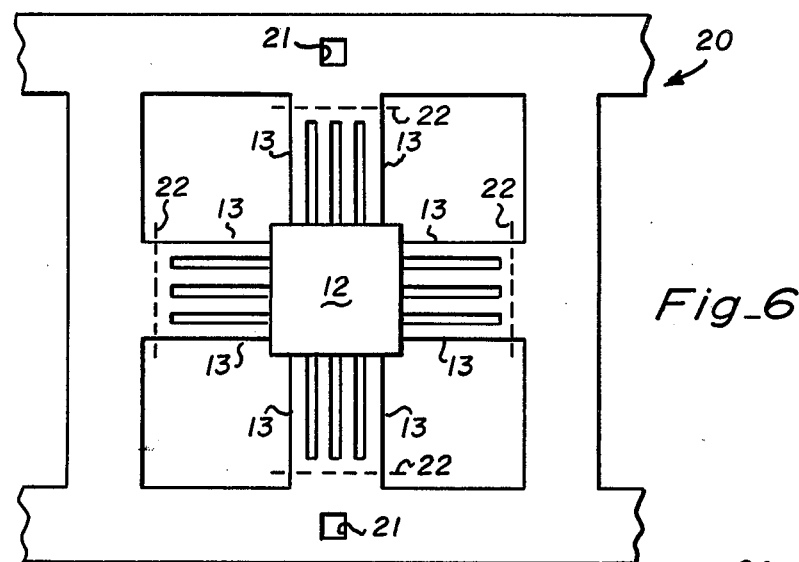
Fig_6
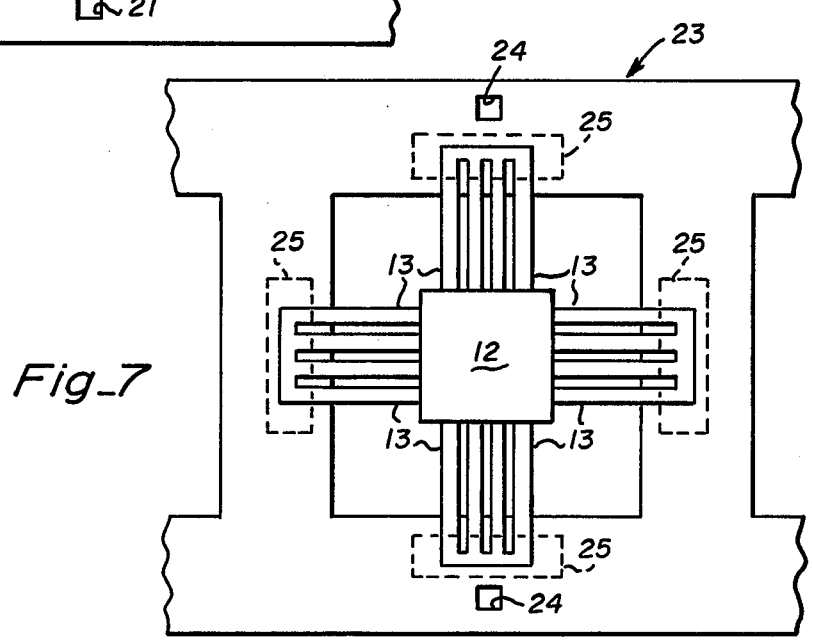
Fig_7
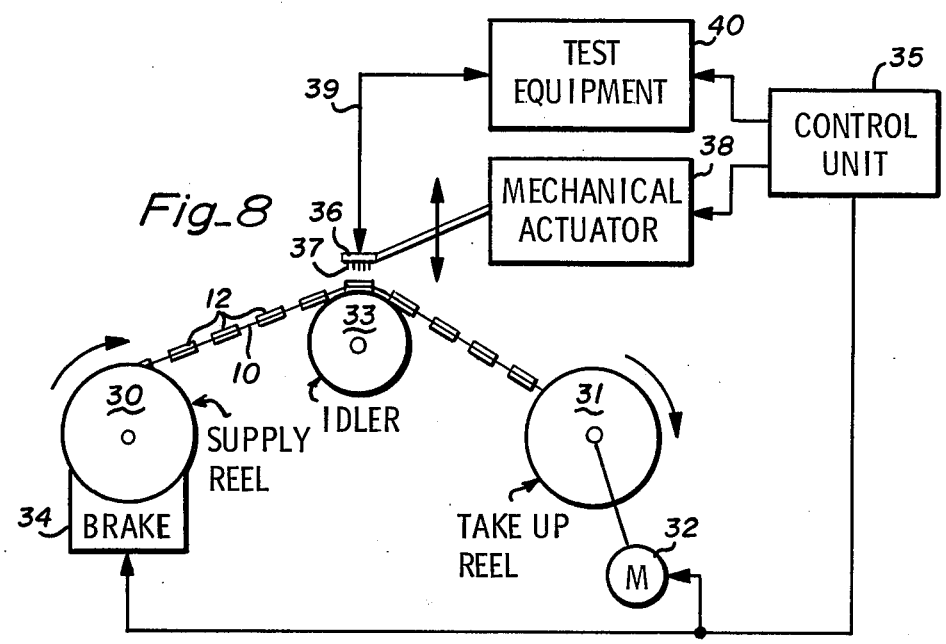
Fig_8

INTEGRATED CIRCUIT PACKAGING PROCESS

BACKGROUND OF THE INVENTION

In my copending patent application titled "Tape Operated Semiconductor Device Packaging," Ser. No. 133,040 filed Mar. 24, 1980 now U.S. Pat. No. 4,330,790 issued May 18, 1982, a metal assembly tape is employed to make contact to the semiconductor device and to produce an encapsulated product. The entire process can be run on automatic assembly equipment that operates at high speed. In another of my copending patent applications titled "A Process for Hermetically Encapsulating Semiconductor Devices," Ser. No. 133,053 filed Mar. 24, 1980 now U.S. Pat. No. 4,355,463 issued Oct. 26, 1982, a ceramic housing is applied in an automatic assembly tape process. These applications are both assigned to the assignee of this application and are incorporated herein by reference.

In these prior assembly approaches the semiconductor device or integrated circuit (IC) is thermocompression gang bonded to bumped fingers on a metal assembly tape. The device package is then assembled onto the same tape which also provides the external package leads. These leads are necessarily quite thin and, especially for large lead-count devices, are also relatively narrow. Once the assembled device is removed from the assembly tape, it is quite easy to deform the package leads. Accordingly, it would be desirable to somehow immobilize the leads prior to device mounting in its final location.

Summery of the Invention

It is an object of the invention to apply an insulating strip to the leads of a device that is assembled and tested in an automatic assembly tape process.

It is a further object of the invention to adhere an insulating strip to the leads of a device that is being assembled on an automatic assembled tape so that the strip can be left in place during assembly and after the device is removed from the tape and mounted in its final location.

It is a still further object of the invention to adhere an insulation strip to the leads of a device assembled in an automatic assembly tape process to hold the leads in place mechanically during testing after the leads are severed from the tape to render the device electrically active and testable.

These and other objects are achieved as follows. A metal assembly tape is processed to create a succession of finger patterns so that each pattern forms a series of device leads. The inner ends of the fingers are arrayed to mate with the bonding pads of the semiconductor device to be encapsulated. These finger tips may be provided with bumps that permit bonding to conventional IC bonding pads. While other methods can be used, I prefer to thermocompression gang bond the bumped fingers to the bonding pads. The outer portions of the fingers are contoured and arrayed to provide the array desired for the exterior leads of the packaged device.

First the semiconductor device is bonded to the assembly tape and it is then encapsulated as desired. Then an insulating strip is cemented across the outer lead pattern. In the original tape finger patterns some dummy fingers ordinarily were created so as to only join to the device package. These dummy fingers ordinarily serve no electrical function and only serve mechanically to hold the packaged device on the tape. Then the electrically functional fingers are severed between the assembly tape and the insulating strip so as to electrically free the leads from the tape. If desired, the leads can at this point be formed to their final shape. Then the devices can be electrically contacted and tested or burnt in while still connected in the tape mechanically. To remove the tested encapsulated device from the tape the dummy fingers are severed where they enter the housing.

In an alternative process, the devices are encapsulated in a metal assembly tape that does not employ dummy fingers. After encapsulation the fingers are excised from the tape so as to leave a strip of metal across their outer ends. This strip will serve to hold the leads in position. Then the packaged devices are mounted on an insulating assembly tape that has prepunched apertures that are slightly smaller than the device lead span. the packaged devices are then associated with an insulating assembly tape. After mounting the metal strips are eliminated, preferably by being punched out, thereby leaving the lead tips bonded to the insulating tape which will henceforth act as the tape transport medium. At this stage the device leads can be contacted for testing and/or burn in on the tape. After excising the devices from the insulating tape, the leads can be formed to shape and the devices mounted in their ultimate location.

BRIEF DESCRIPTION OF THE DRAWING

FIG. 1 shows a metal tape having sprocket holes and one finger pattern representative of a succession of such patterns;

FIG. 2 is a cross section of a mounted semiconductor device;

FIG. 3 shows insulating strips in a place on the structure of FIG. 1 and also shows where the tape can be punched to sever and electrically isolate the leads;

FIG. 4 shows the severed leads;

FIG. 5 is a cross section of the device of FIG. 4 after lead forming;

FIG. 6 shows an alternative form of metal tape construction and shows where the leads can be excised from the tape;

FIG. 7 shows the device of FIG. 6 mounted on an insulating assembly tap showing where punching can be employed to electrically isolate the package leads; and FIG. 8 is a block diagram-schematic of a system useful in practicing the invention.

DESCRIPTION OF THE INVENTION

FIG. 1 shows a segment of a metal tape 10 having sprocket holes 11 at the edges for advancing and indexing the tape. A set of fingers forming a desired pattern is shown between the index holes. It is to be understood that a succession of such patterns exist along the tape, and these are created by punching and/or photolithographic etching in the well-known manner. It is preferred that the tape is created from rolled 2.6 mil thick copper alloy 110 processed to full hardness. A packaged semiconductor device is shown at 12. To avoid a very complicated drawing, a 16-lead structure is shown. In practice, the invention can be used on practically any package such as a 240 lead (60 leads per side) very large scale integrated circuit (VLSIC) or a 120 lead (30 leads per side) or other smaller lead count packages. The packaging process is well suited to very high speed integrated circuit (VHSIC) approaches because of the thin, short, high conductivity leads.

Assembly tape 10 is provided with a series of package leads 13 created when the tape is manufactured. A series of dummy leads 14 are also shown (four in the pattern illustrated). These normally terminate in the package 12 and serve to hold it in place mechanically. These dummy leads normally serve no electrical function but could be used electrically or thermally if desired.

A cross-section of a proposed device is shown in FIG. 2. The actual device construction plays no part in this invention and any desired form could be used. For example, the structure disclosed in my copending application Ser. No. 133,053 filed Mar. 24, 1980 now Pat. No. 4,355,463 issued Oct. 26, 1982, could be used. Alternatively, other ceramic structures or molded plastic could be used. It is only necessary that the package be capable of being applied on an assembly tape. In FIG. 2, tape leads 13 are shown attached to IC chip 15 by bumps at the ends which are preferably thermocompression bonded. The parts that make up housing 12 need only to be insulating and to form the approximate outline shown. It should be noted that while a square device is illustrated in FIG. 1, it could be rectangular, round, or oval if desired.

Once the structure of FIG. 1 is achieved, strips 16 are applied as shown in FIG. 3. These four strips can be made of 3 mil polyimide that is coated with 1 mil of B-staged epoxy adhesive. Lamination can be accomplished by applying a pressure of about 30 pounds per square inch at about 140° C. for about 4 seconds. If desired, a further cure can be employed to fully set the epoxy cement.

The dashed outlines at 17 represent where holes can be punched into the tape to electrically isolate the leads 13. After punching the structure of FIG. 4 is present. It can be seen that the leads 13 are electrically isolated and firmly held in place by strips 16. Dummy fingers 14 retain the completed devices in the assembly tape. At this point test probes can be brought into contact with leads 13 for testing or burn-in as will be described hereinafter.

Basically, the assembly tape can be employed in the creation of the finished product completely through assembly and testing of the IC devices. Therefore, the use of high speed fabrication and test equipment is greatly facilitated.

If desired the devices can be lead formed in the assembly stage of FIG. 4. In the typical manufacturing process the package leads are, at some stage, bent into the form in which the user wants them. In the assembly tape process such bending can be accomplished by automatic forming machines which can be applied to the tape process itself.

FIG. 5 shows a cross-section of the lead shape for a typical structure. The forming can be accomplished either before or after testing and/or burn-in. Since package 12 is conventional, it is shown as a featureless insulating block and a preferred forming illustrated for one application. The leads 13 from the original tape 10 are formed downward and cemented to the housing by adhesive 18. Then the leads angle downward and the tips which include strips 16 are bent upwardly. The U-shaped structure is designed to accomodate a reflow soldering tool which will be used to solder the completed structure to a printed circuit board or other equivalent substrate. The originally applied insulating strips can either be removed after soldering or they can be left in place because they will have no electrical effect on the finished product. In fact, strips 16 will act to avoid accidental contact between adjacent devices which could be very helpful in high device density printed circuit boards. In the final assembly, solder is applied to the under side of leads 13 and a ring-shaped soldering tool inserted inside the U-shaped section. The soldering tool is ordinarily employed to locate the device in its approximate position and to tack bond it in place. Then a reflow soldering soldering process is employed where the leads are selectively heated. When the solder melts, surface tension acts in the well-known manner to self-align the device in place.

FIGS. 6 and 7 illustrate an alternative assembly approach. A metal assembly tape 20 is shown in FIG. 6. Index and transport holes 21 exist along the longitudinal edges. Fingers 13 are employed as described above to contact the active device inside package 12. The assembly is as was described for the structure of FIG. 1 up to where the package is completed. However, it will be noted that no dummy fingers are employed. The metal tape is made so that when the structure is excised along lines 22, the leads 13 are joined together in groups by shorting bars that act to hold the leads in position.

The metal leads on device 12 are then bonded to an insulating tape 23 as shown in FIG. 7. Tape 23 has indexing and transport holes 24 and prepunched apertures that are slightly smaller than the outward extensions of leads 13. In the overlap region insulating tape 23, which is preferably of polyimide, is provided with a B-staged epoxy coating. Thus the packaged structure with its leads are cemented using heat and pressure, as described above, to create the structure of FIG. 7. At this point the areas inside dashed lines 25 are punched out. This leaves a narrow polyimide strip bonded to the extremities of leads 13 which are now electrically isolated. As before, the devices can be probed for electrical testing and/or burn-in the manner described. From a tape standpoint the handling is the same as for FIG. 4. After such testing is completed, the devices are excised from the assembly tape thereby leaving the completed device with the insulating strips bonded along the lead extremities. They can then be lead formed and employed as described above.

FIG. 8 is a block diagram partial schematic diagram of a machine useful in testing and/or burn in of devices packaged on an assembly tape. The tape 10 with its packaged devices 12 is wound on a reel 30 for automatic handling. Take up reel 31 is driven by motor 32 to advance the tape over idler roll 33. A braking device 34 retards supply reel 30 so that the tape is in tension between reels. Motor 32 and brake 34 are operated by control unit 35 which advance the tape and determine the correct tape tension. While not shown some form of indexing device, operating on optical of mechanical sensing, permits control unit 35 to increment the tape so that the packaged devices are sequentially advanced into position on idler roll 33.

A conventional probe card 36, which contains a probe contact array 35 of the kind widely used in hybrid IC assembly, is moved vertically be a mechanical actuator 38. Probe card 36 is moved upward out of contact with the tape and the tape advanced so as to place the next packaged device in position. The advance is then halted and the probe card lowered into contact with the tape. Cable 39 joins the probe card contacts 37 with test apparatus 40 which applies operating potentials and input signals to the packaged IC. The output signals are sensed and the IC evaluated. If desired, the IC can be marked or branded by well known devices and techniques not shown.

While the test setup of FIG. 8 is primarily intended for evaluating the packaged IC, it can also serve as a burn in system. Here the IC is run at particular operating potentials and currents for a period of time that will act to induce any early failures. After the burn in is completed, the device is tested to determine its condition. For the burn in function it is contemplated that the showing in FIG. 8 would be modified so that a plurality of probe card stations would be incorporated between reels 30 and 31. Thus a plurality of devices could be energized simultaneously.

The invention has been described along with two methods of assembly. When a person skilled in the art reads the foregoing description, alternatives and equivalents, within the spirit and intent of the invention, will become apparent. For example, the semiconductor-to-finger bonds could be by soldering and tape metals other than copper can be employed. Accordingly, it is intended that the scope of the invention be limited only by the claims that follow.

I claim:

1. In a process for tape automatic assembly of integrated circuits, including the steps of forming a metal assembly tape having a succession of metal finger patterns, each pattern having a plurality metal fingers that extend inwardly to form an array that mates with the bonding pads on an integrated circuit chip and that extend outwardly of said bonding pads to form package leads that will act to provide mechanical mounting as well as electrical contact means for said integrated circuit chip bonding said integrated circuit chip to said inwardly extending fingers so that said chip becomes a part of said metal assembly tape, applying packaging means to said assembly tape for encapsulating said integrated circuit chip and the inwardly extending portions of said metal fingers so that said outwardly extending portions extend beyond said packaging means, testing said encapsulated integrated circuit while attached to the tape, and finally excising said integrated circuit from said tape whereby said integrated circuit can be mounted in final form, the improvement comprising:

applying a strip of insulating material to the outer ends of said metal finger patterns prior to excising said integrated circuits from said tape whereby said package leads are held in position during subsequent testing, processing, and handling.

2. The improvement of claim 1 wherein said strip of insulating material is applied to said metal assembly tape in a fabrication step just prior to where said finger patterns are excised from said tape to render said integrated circuits testable.

3. The improvement of claim 2 wherein said strip is composed of polyimide.

4. The improvement of claim 3 wherein said polyimide strip has a surface coat of B-staged epoxy.

5. The improvement of claim 1 wherein said metal assembly tape with said metal finger patterns is provided with dummy fingers not related to electrical contact means of said final form of said integrated circuit, said dummy fingers being formed to associate solely with said packaging means whereby said encapsulated integrated circuit can be electrically isolated from said assembly tape and yet remain mechanically attached thereto.

6. The improvement of claim 5 wherein said tape assembly process includes the steps of excising said outer finger patterns associated with the electrical contact means for said integrated circuit, forming said excised outer finger patterns to shape said package leads and contacting said excised outer finger pattern for integrated circuit testing and burn-in.

7. The improvement of claim 6 wherein said packaged integrated circuit is further contacted by a probe card having contact probes that are arrayed to mate with said outer finger patterns.

8. The improvement of claim 1 wherein said process includes the steps of:

forming a packaged device on a metal assembly tape;

excising the thus packaged device from said metal assembly tape so as to leave a metal bar joining said outer metal finger patterns together;

bonding the thus excised packaged device onto an insulating assembly tape having apertures slightly smaller than the span of said outer finger pattern so that said metal bar lies over a portion of said insulating assembly tape, and excising that portion of said assembly tape that lies over said metal bar to remove said bar and thereby electrically isolate said outer finger patterns.

9. The improvement of claim 8 including the further steps of excising said packaged and tested device from said insulating assembly tape and forming said leads to a predetermined shape.

10. An assembly tape made in accordance with the process of claim 1.

* * * * *